(12) United States Patent
Jin

(10) Patent No.: US 6,642,785 B2
(45) Date of Patent: Nov. 4, 2003

(54) POWER LINEARIZER OF A CDMA SYSTEM AND METHOD THEREOF

(75) Inventor: Min-Ho Jin, Choongchungnam-Do (KR)

(73) Assignee: LG Electronics Inc., Seoul (KR)

(*) Notice: Subject to any disclaimer, the term of this patent is extended or adjusted under 35 U.S.C. 154(b) by 1 day.

(21) Appl. No.: 10/026,827

(22) Filed: Dec. 27, 2001

(65) Prior Publication Data
US 2002/0113647 A1 Aug. 22, 2002

(30) Foreign Application Priority Data
Dec. 30, 2000 (KR) .......................................... 2000-87333

(51) Int. Cl.⁷ .............................. H03G 3/20; H03F 1/26
(52) U.S. Cl. ........................ 330/149; 330/129; 330/136
(58) Field of Search ................................ 330/129, 136, 330/149; 325/297

(56) References Cited

U.S. PATENT DOCUMENTS

| | | | | |
|---|---|---|---|---|
| 4,737,731 A | * | 4/1988 | Swanson et al. ............ 330/149 |
| 5,111,155 A | * | 5/1992 | Keate et al. ................ 330/149 |
| 5,959,500 A | * | 9/1999 | Garrido ...................... 330/151 |
| 6,054,894 A | * | 4/2000 | Wright et al. ............... 330/149 |
| 6,069,530 A | * | 5/2000 | Clark .......................... 330/149 |
| 6,240,144 B1 | * | 5/2001 | Ha ............................. 375/297 |

* cited by examiner

*Primary Examiner*—Patricia Nguyen
(74) *Attorney, Agent, or Firm*—Fleshner & Kim, LLP

(57) ABSTRACT

A power linearizer of a CDMA system preferably includes a linearization input unit for compensating a level of an input signal to remove a non-linearity of a power amplifier; an amplification controller for controlling an amplification of the power amplifier; and the power amplifier operated under the control of the amplification controller, for amplifying the power of the level-compensated input signal. By adjusting the voltage inputted to the input terminal of the voltage controlled power amplifier (VCA), the non-linearity of the VCA can be accurately compensated and the power compensation can be easily performed. In addition, the capacity of the CDMA system can be increased.

28 Claims, 3 Drawing Sheets

POWER LINEARIZER OF A CDMA SYSTEM AND METHOD THEREOF

BACKGROUND OF THE INVENTION

1. Field of the Invention

The present invention relates to a CDMA system, and more particularly, to a power linearizer of a CDMA system.

2. Background of the Related Art

In general, a radio frequency band amplifier using active elements generates many undesired distortion components according to a change of a power level.

Especially when the amplifier is operated in the vicinity of a saturation area, a non-linear phenomenon remarkably appears to distort an amplitude and a phase of an output, and when more than two signals are inputted, inter-modulation distortion (MD) components are generated between the input signals, having much influence on the adjacent channel.

The IMD components work as a noise source to degrade a transmission quality of a communication system and reduce a capacity of the CDMA system.

FIG. 1 is a schematic block diagram of a related art power linearizer of a CDMA system. As shown therein, the related art power linearizer includes an input unit 10 for converting a digital input signal (s[n]) into an analog signal(s(t)), a linearization amplifying controller 20 for performing an amplification control to remove a non-linear characteristic of a power amplifier 30, and a power amplifier 30 for amplifying a power of an input signal (s(t)) inputted from the input unit 10 under the control of the linearization amplifying controller 20.

The input unit 10 includes a multiplier 11 for multiplying the digital input signal (s[n]) and a transmission gain signal (g[n]) together, and a digital-to-analog converter 12 for converting the digital signal outputted from the multiplier 11 to an analog signal.

The linearization amplifying controller 20 includes a multiplier 21 for multiplying power control information (c[n]), which controls an increase and decrease of amplification, and a power control step (P) indicative of an increased or decreased power value. It further includes an accumulator 22 for accumulating an output signal of the multiplier 21, an adder 23 for adding a digital output signal of the accumulator 22 and an adjust gain (a[n]) for removing a non-linear characteristic of the power amplifier 30, and a digital-to-analog converter 24 for converting the digital signal outputted from the adder 23 into an amplification control signal of an analog form.

The power control information c[n] has a control value of 1 or 2 in digital form. One control value increases the power as high as a specified value and the other control value decreases the power as low as a specified value. The specified power value refers to the power control step (P).

The multiplier 21 of the linearization amplifying controller 20 multiplies the power control information c[n] and the power control step (P), and the accumulator 22 accumulates the output signal of the multiplier 21.

The adder 23 adds the output signal of the accumulator 22 and the adjust gain (a[n]) and outputs an amplification control signal for controlling amplification of the power amplifier 30 so as to remove a non-linear characteristic of the power amplifier 30. The adjust gain a[n] is a value to adjust the amplification so that the non-linear power amplifier 30 may have a linearity. The value of a[n] used for generating the amplification control signal to remove the non-linear characteristic of the power amplifier 30 is critical.

The digital/analog converter 24 of the linearization amplifying controller 20 converts the output signal of the adder 23 into an analog form, and generates an analog amplification control signal (v(t)) to control an amplification level of the power amplifier 30.

The multiplier 11 of the input unit 10 multiplies the digital input signal (s[n]) and the transmission gain signal (g[n]), and the digital/analog converter 12 of the input unit 10 converts the digital signal outputted from the multiplier 11 into an analog signal s(t) and outputs it to the power amplifier 30.

The power amplifier 30 amplifies the power of the output signal s(t) of the digital/analog converter 12 according to the analog amplification control signal (v(t)) outputted from the digital/analog converter 24 of the linearization amplifying controller 20.

FIG. 2 is a graph showing power characteristic curves of a power linearizer in accordance with the related art amplifier. As shown, PA(V) indicates an actual power characteristic curve of the power amplifier 30, PB(V) indicates a required linear power characteristic curve, and PC(V) indicates a power compensation curve to remove the non-linear characteristic.

In the CDMA system, in order to minimize the influence on the adjacent channel and increase the subscriber accommodation capacity, each mobile terminal should use the minimum power.

With reference to FIG. 2, on the assumption that a desired power is $P_2$, when the power amplifier 30 has a linear characteristic, $V_1$ is to be applied to the power amplifier 30 as a value of the input signal. However, when the voltage of $V_1$ is inputted, the power amplifier 30 outputs a power of $P_1$ according to the non-linear characteristic.

Accordingly, the power of $P_2$ should be obtained through the power compensation. That is, as shown in the output characteristic of the power amplifier 30, an input voltage of $V_2$ is necessary to output the accurate $P_2$.

Thus, the value of $V_1 \sim V_2$ is compensated by using a value of the amplification control signal v(t) of the power amplifier 30, and the value of the adjust gain a[n] used for generating the corresponding amplification control signal v(t) is to be generated.

The value of a[n] is computed by using a difference value between a requested input voltage according to the linearization characteristic curve for outputting a desired power and an actual input voltage according to a nonlinear characteristic curve for outputting the desired power. The conventional power linearizer has the adjust gain a[n], that is, the compensation value for outputting a desired power, in a table form. Accordingly, a value to be compensated at an arbitrary point (an input voltage) is computed by linearly interpolating a corresponding value stored in the table.

The power linearizer of the related art has many problems. For example, the conventional power linearizer should have a slope of a straight line for interpolation and an offset value, and a power compensation value at an arbitrary position of the equation of the straight line should be computed, which makes it complicated to implement the power linearizer.

In addition, the conventional power linearizer compensates the power by adjusting the amplification control signal of the amplifier as much as an error between the linear power (a requested power) and the non-linear power. In this respect, the amplification control signal controls the amplification of the power amplifier in an analog format. Since analog signals are influenced by noise, it is difficult to accurately control the power.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a power linearizer of a CDMA system that is capable of accurately and easily compensating a non-linearity of a voltage controlled power amplifier (VCA).

Another object of the present invention is to provide a power linearizer of a CDMA system that is capable of increasing a capacity of the CDMA system by controlling a digital gain of the VCA.

To achieve at least the above objects in whole or in part and in accordance with the purpose of the invention, as embodied and broadly described herein, there is provided a power linearizer, including a power amplifier configured to amplify a compensated analog input signal into a control signal, a linearization input circuit coupled to receive a digital input signal and generate the configured to compensated analog input signal to compensate for a non-linear characteristics of the power amplifier, and an amplification controller configured to control an amplification of the power amplifier.

To further achieve at least the above objects in whole or in part and in accordance with the purpose of the invention, as embodied and broadly described herein, there is provided a power linearizer, including an adder configured to add a gain adjust to compensate for a non-linear characteristic of a voltage controlled power amplifier and a transmission gain signal, and to output a digital gain signal, a multiplier configured to multiply the digital gain signal and a digital input signal to provide a compensated digital input signal, and a digital/analog converter configured to convert the compensated digital input signal into a compensated analog input signal.

To further achieve at least the above objects in whole or in part and in accordance with the purpose of the invention, as embodied and broadly described herein, there is provided a power linearizing method, including computing an power error value between a linear power ($P_2$) and a nonlinear power ($P_1$) for an input voltage, square root processing the power error value and computing an adjust gain value, adjusting a transmission gain signal using the adjust gain value, ompensating a level of a digital input signal using the adjusted transmission gain signal, and amplifying a power of the level-compensated input signal and outputting a linearized power signal.

To further achieve at least the above objects in whole or in part and in accordance with the purpose of the invention, as embodied and broadly described herein, there is provided a power linearizer, including means for computing an power error value between a linear power ($P_2$) and a nonlinear power ($P_1$) for an input voltage, means for SQUARE ROOT processing the computed power error value and computing an adjust gain value, means for adjusting a transmission gain signal by using the computed adjust gain value, means for compensating a level of a digital input signal by using the adjusted transmission gain signal, and means for amplifying a power of the level-compensated input signal and outputting a linearized power signal.

To further achieve at least the above objects in whole or in part and in accordance with the purpose of the invention, and embodied and broadly described herein, there is provided a method of compensation a non-linear characteristic of a power amplifier, including adding a digital compensation signal to a digital gain adjust signal to generate an adjusted digital compensation signal, applying the adjusted digital compensation signal to a digital input signal to generate an adjusted digital input signal, and converting the adjusted digital input signal to an adjusted analog input signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In the preferred embodiment, in order to remove non-linearity to have a linear characteristic, a level of a voltage inputted to a power amplifier is preferably adjusted rather than adjusting an amplification control signal of the power amplifier.

Figure 1:
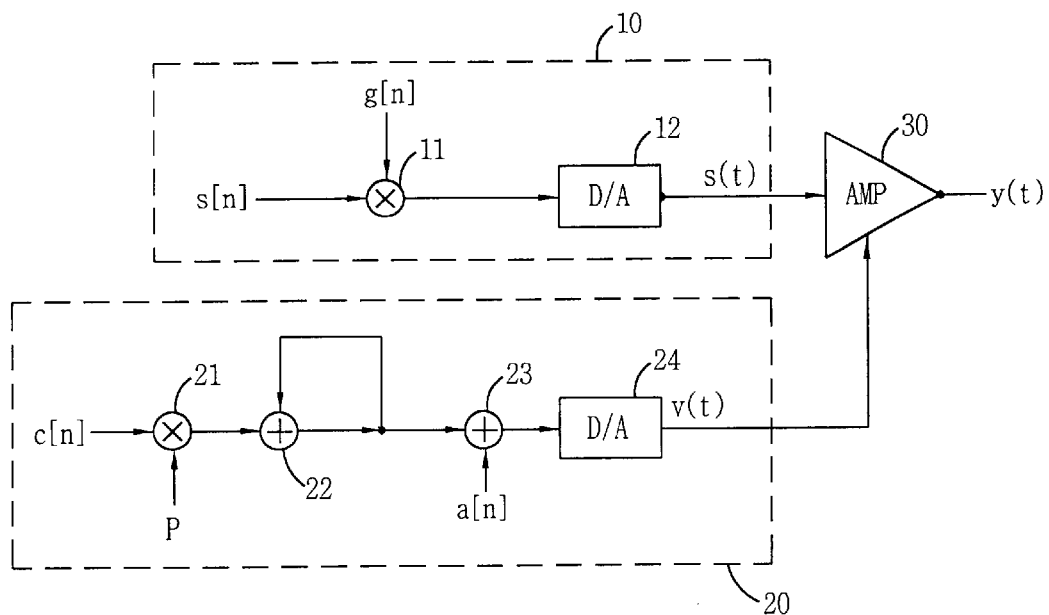
FIG. 1 is a schematic block diagram showing the construction of a related art power linearizer of a CDMA system.
Figure 2:
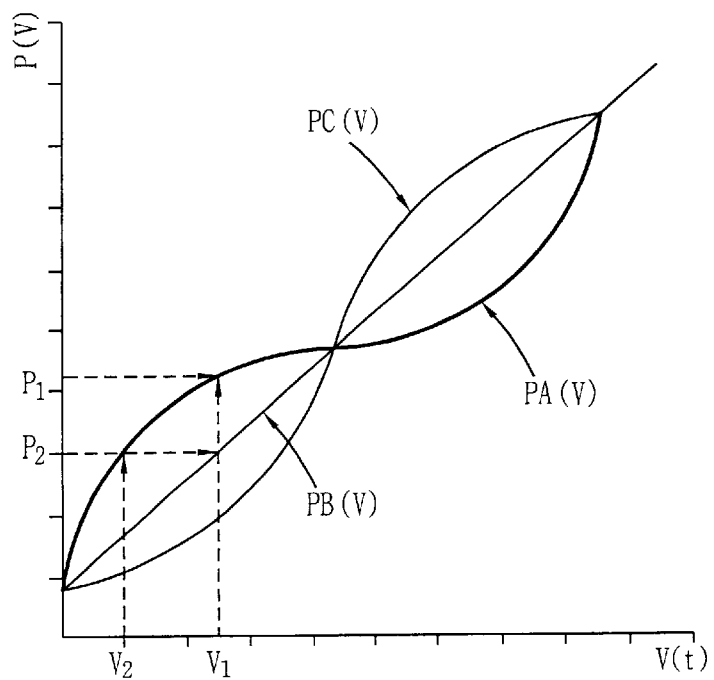
FIG. 2 is a graph showing power characteristic curves of the related art power linearizer.
Figure 3:
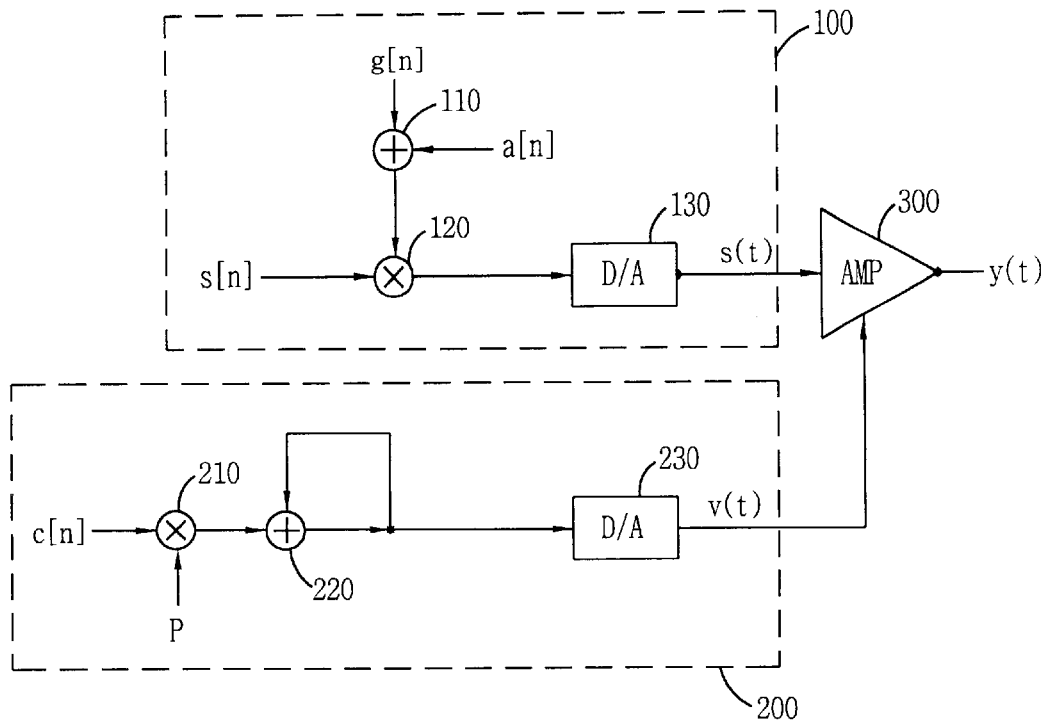
FIG. 3 is a schematic block diagram showing the construction of a power linearizer of a CDMA system in accordance with a preferred embodiment of the present invention.

FIG. 3 is a schematic block diagram showing the construction of a power linearizer of a CDMA system in accordance with a preferred embodiment of the present invention. As shown therein, an adjust gain (a[n]) is added to the transmission gain signal g[n], to produce linearity in the power amplifier.

Referring to FIG. 3, the power amplifier preferably includes a linearization input unit 100 to compensate a level of an input signal to remove a non-linearity of a power amplifier 300, an amplification controller 200 to control amplification of the power amplifier 300, and a power amplifier 300 operated under the control of the amplification controller 300, to amplify a power of a signal s(t) outputted from the linearization input unit 100.

The linearization input unit 100 preferably includes an adder 110 to add an adjust gain (a[n]) to a transmission gain signal (g[n]). The adjust gain value a[n] preferably removes the non-linear characteristic of the power amplifier 300 and the transmission gain g[n] adjust a digital gain. The linearizer input unit 100 further includes a multiplier 120 to multiply the digital gain outputted from the adder 110 and the digital input signal (s[n]) and adjust a level of the digital input signal, and a digital/analog converter 130 to convert the digital input signal, which has been level-adjusted by the multiplier 120, to an analog signal.

The amplification controller 200 preferably includes a multiplier 210 for multiplying a power control information (c[n]) for controlling an increase or decrease of amplification and a power control step (P) indicative of a power value to be increased or decreased. The amplification controller 200 also preferably includes an accumulator 220 for accumulating the output signal of the multiplier 210; and a digital/analog converter 230 for converting the amplification control signal (v(t)) in a digital form outputted from the accumulator 220 into an analog form, and controlling the power amplifier 300.

Figure 4:
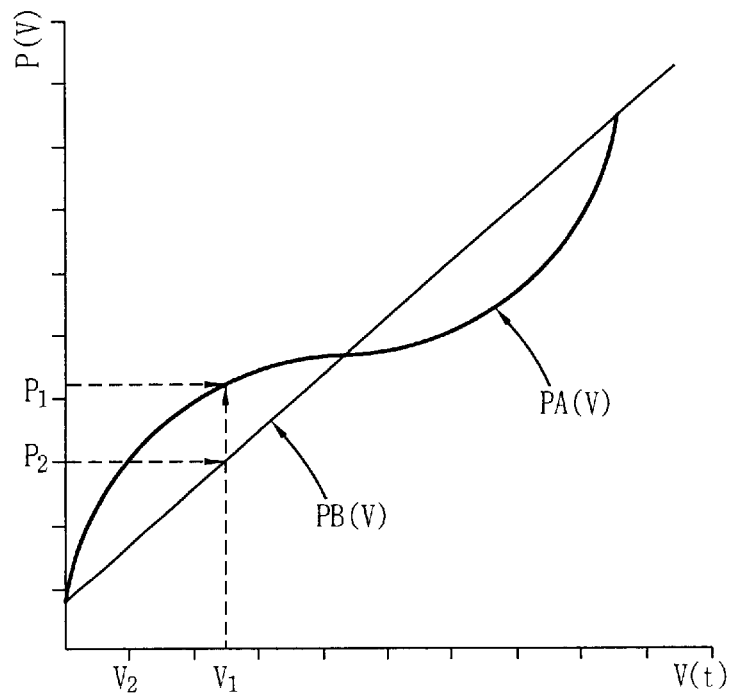
FIG. 4 is a graph showing a power characteristic curve of a power linearizing method in accordance with the preferred embodiment of the present invention.

FIG. 4 is a graph showing a power characteristic curve adopted to a power linearizing method in accordance with a preferred embodiment of the present invention. As shown therein, PA(V) indicates an actual power characteristic curve of the power amplifier 300, and PB(V) indicates a requested linear power characteristic curve.

On the assumption that a desired power is $P_2$, when the power amplifier 300 is operated according to the linear power characteristic curve of PB(V), the input voltage of $V_1$ is preferably applied to the power amplifier 300. In this respect, however, the power amplifier 300 may actually output a power according to the non-linear power characteristic such as PA(V).

Accordingly, when the input voltage of $V_1$ is applied to the power amplifier 300, the power of $P_1$ may be outputted. Thus, the difference between the desired power and the actually outputted power is $P_1-P_2$. In the preferred embodiment, the error of the output power, that is, $P_1-P_2$, preferably is compensated to remove the non-linearity of the power amplifier 300.

Figure 5:
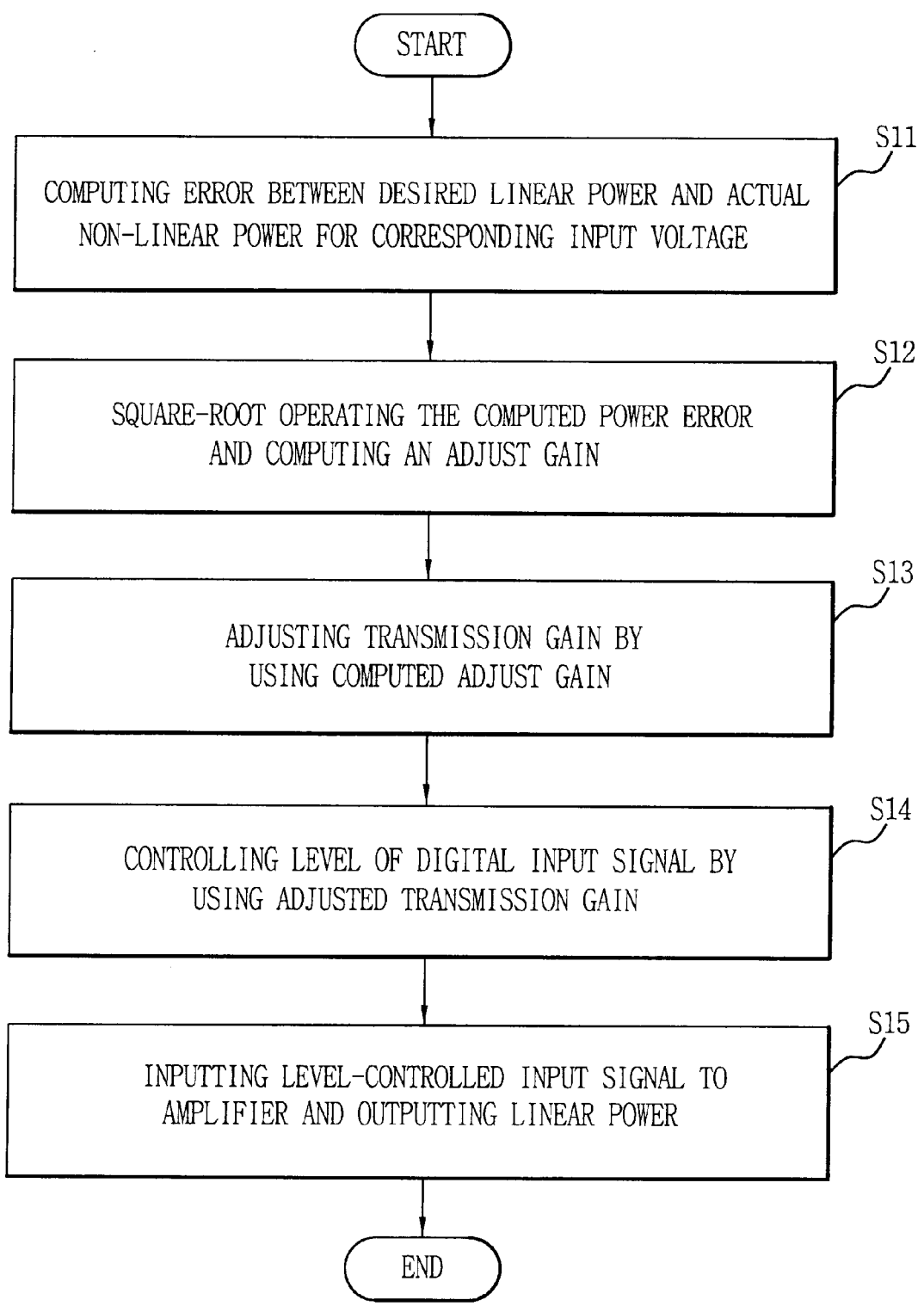
FIG. 5 is a flow chart of the power linearizing method of a CDMA system in accordance with the preferred embodiment of the present invention.

FIG. 5 is a flow chart of the power linearizing method of a CDMA system in accordance with the preferred embodiment of the present invention. In order to compensate the difference value (the power error) between the actual non-linear power $P_1$ corresponding to the input voltage $V_1$ and the desired linear power $P_2$, the power error $|P_1-P_2|$ is preferably computed in step S11.

When a power error is computed for a corresponding input voltage, an adjust gain a[n] is preferably computed in the following equation (1) for the power error in step S12.

$$a[n] = -sqrt|P_1 - P_2| \quad (P_1 > P_2) \\ = sqrt|P_1 - P_2| \quad (P_2 > P_1)$$

Equation 1

In this manner, the power linearizer of the present invention preferably computes the adjust gain a[n] for the finite number of input voltages by using the characteristic curve of input voltage to output voltage, and may store the corresponding input voltage and the adjust gain in a look up table.

Thereafter, the adjust gain a[n] searched from the look-up table for the current input voltage is preferably inputted to the adder 110 of the linearization input unit 100. The adder 110 preferably adds the transmission gain signal g[n] and the adjust gain a[n] and adjusts the transmission gain signal g[n] in step S13.

The adjusted transmission gain is preferably inputted to the multiplier 120. Then, the multiplier 120 may multiply the current digital input voltage s[n] and the adjusted transmission gain together to adjust the level of the digital input signal in step S14.

The level-adjusted input signal is preferably inputted to the digital/analog converter 130 and converted into an analog form, and then applied to the power amplifier 300 in step S15.

The power amplifier receives the analog input signal which has been level-adjusted to remove the non-linearity and amplifies the power. Thus, the power-amplified signal obtains the linear characteristic. The power is compensated by controlling the level of the input signal, which is more resistant to noise than the amplification control signal of the power amplifier. Therefore the power linearization of the power amplifier can be more accurately and easily controlled.

As so far described, the power linearizer of a CDMA system and its method of the preferred embodiment have many advantages. For example, by adjusting the voltage inputted to the input terminal of the voltage controlled power amplifier (VCA), the non-linearity of the VCA can be accurately compensated. Additionally, the power compensation can be more easily performed. Moreover, the capacity of the CDMA system can be increased.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A power linearizer, comprising:

a linearization input circuit coupled to receive a digital input signal and generate a compensated analog input signal to compensate for non-linear characteristics of a power amplifier, the compensated analog input signal being generated with a gain adjust signal that compensates the non-linear characteristics of the power amplifier;

an amplification controller configured to control an amplification of the power amplifier; and a wherein the power amplifier is coupled to amplify the compensated analog input signal in accordance with a control signal.

2. The linearizer of claim 1, wherein the linearization input circuit comprises:

a logic unit configured to combine the gain adjust signal, with a transmission gain signal to output a digital gain signal;

a multiplier configured to multiply the digital gain signal and the digital input signal to provide a compensated digital input signal; and a digital/analog converter configured to convert the compensated digital input signal into a compensated analog input signal.

3. The power linearizer of claim 2, wherein the gain adjust signal is computed by square root processing an error value between a linear power ($P_2$) and a non-linear power ($P_1$).

4. The power linearizer of claim 3, wherein the error value is equal to an absolute value of $P_1-P_2$, wherein square root processing is equal to a negative square root of the error value when $P_1$ is greater than $P_2$, and wherein the square root processing is a positive square root of the error value when $P_2$ is greater than $P_1$.

5. The power linearizer of claim 3, wherein $P_2$ is a desired power output of the power amplifier and $P_1$ is an uncompensated power output of the power amplifier.

6. The power linearizer of claim 1, wherein the amplification controller comprises:
   a multiplier configured to multiply a power control information to control an increase or decrease of amplification and a power control step signal indicative of an increased or decreased power value;
   an accumulator configured to accumulate an output signal of the multiplier; and
   a digital/analog converter configured to convert a digital amplification control signal outputted from the accumulator into an analog form to control the power amplifier.

7. A power linearizer, comprising:
   an adder configured to add a gain adjust signal and a transmission gain signal to generate a digital gain signal, the gain adjust signal configured to compensate for a non-linear characteristic of a voltage controlled power amplifier;
   a multiplier coupled to multiply the digital gain signal and a digital input signal to generate a compensated digital input signal; and
   a digital/analog converter coupled to convert the compensated digital input signal into a compensated analog input signal.

8. The power linearizer of claim 7, further comprising a voltage controlled amplifier coupled to receive an amplification control signal, and configured to amplify a power of the compensated analog input signal.

9. The power linearizer of claim 7, further comprising an amplification control signal generator configured to control the voltage controlled power amplifier.

10. The power linearizer of claim 9, wherein the amplification control signal generator includes:
    a multiplier configured to multiply a power control information to control an increase or decrease of amplification and a power control step signal indicative of an increased or decreased power value;
    an accumulator configured to accumulate an output signal of the multiplier; and
    a digital/analog converter configured to convert a digital amplification control signal outputted from the accumulator into an analog form to control the power amplifier.

11. The power linearizer of claim 7, wherein the gain adjust signal is computed by square root processing an error value between a linear power ($P_2$) and a non-linear power ($P_1$).

12. The power linearizer of claim 11, wherein the error value is equal to an absolute value of $P_1-P_2$, and wherein the square root processing comprises taking a negative square root of the error value when $P_1$ is greater than $P_2$, and wherein the square root processing comprises taking a positive square root of the error value when $P_2$ is greater than $P_1$.

13. A power linearizing method, comprising:
    computing an power error value between a linear power ($P_2$) and a nonlinear power ($P_1$) for an input voltage;
    square root processing the power error value and computing an adjust gain value;
    adjusting a transmission gain signal using the adjust gain value;
    compensating a level of a digital input signal using the adjusted transmission gain signal; and
    amplifying a power of the level-compensated input signal to generate a linearized power signal.

14. The method of claim 13, wherein adjusting the transmission gain signal comprises:
    storing each of a plurality of input voltages and corresponding adjust gain values in a table;
    selecting an adjust gain value for the input voltage from the table; and
    adding the selected adjust gain value to the transmission gain and adjusting the transmission gain.

15. The power linearizing method of claim 13, wherein the error value is equal to an absolute value of $P_1-P_2$, and wherein the square root processing comprises taking a negative square root of the error value when $P_1$ is greater than $P_2$, and wherein the square root processing comprises taking a positive square root of the error value when $P_2$ is greater than $P_1$.

16. The power linearizing method of claim 13, further comprising providing an amplification control signal to a power amplifier to control the amplification of the level-adjusted compensated input signal.

17. The power linearizing method of claim 16, wherein providing an amplification control signal comprises:
    multiplying a power control information for controlling an increase or decrease of amplification and power control step indicative of an increased or decreased power value together;
    accumulating an output signal of the multiplier; and
    converting an amplification control signal in a digital form outputted from the accumulator into an analog form, and
    controlling the power amplifier using the amplification control signal.

18. A power linearizer, comprising:
    means for computing a power error value between a linear power ($P_2$) and a nonlinear power ($P_1$) for an input voltage;
    means for SQUARE ROOT processing the computed power error value and computing an adjust gain value;
    means for adjusting a transmission gain signal by using the computed adjust gain value;
    means for compensating a level of a digital input signal by using the adjusted transmission gain signal; and
    means for amplifying a power of the level-compensated input signal and outputting a linearized power signal.

19. The power linearizer of claim 18, wherein the error value is equal to an absolute value of $P_1-P_2$, and wherein SQUARE ROOT processing is equal to a negative square root of the error value when $P_1$ is greater than $P_2$, and wherein the SQUARE ROOT processing is a positive square root of the error value when $P_2$ is greater than $P_1$.

20. The power linearizer of claim 18, further comprising means for generating an amplification control signal and outputting the amplification control signal to the means for amplifying.

21. A method of compensating a non-linear characteristic of a power amplifier, comprising:
    adding a digital compensation signal to a digital gain adjust signal to generate an adjusted digital compensation signal;

applying the adjusted digital compensation signal to a digital input signal to generate an adjusted digital input signal; and converting the adjusted digital input signal to an adjusted analog input signal.

22. The method of claim 21, further comprising amplifying the adjusted analog input signal in accordance with an amplification control signal to generate a linear output signal.

23. The method of claim 22, further comprising generating an amplification control signal.

24. The method of claim 23, wherein generating an amplification control signal comprises:

multiplying a power control information to control an increase or decrease of amplification and a power control signal indicative of an increased or decreased power value;

accumulating an output signal of the multiplier; and converting a digital amplification control signal outputted from the accumulator into an analog form to control the power amplifier.

25. The method of claim 21, wherein the gain adjust signal is computed by SQUARE ROOT processing an error value between a linear power ($P_2$) and a non-linear power ($P_1$).

26. The method of claim 25, wherein the error value is equal to an absolute value of $P_1-P_2$, and wherein SQUARE ROOT processing is equal to a negative square root of the error value when $P_1$ is greater than $P_2$, and wherein the square root processing is a positive square root of the error value when $P_2$ is greater than $P_1$.

27. The method of claim 26, wherein P2 is a desired power output of the power amplifier and P1 is an uncompensated power output of the power amplifier.

28. The method of claim 21, wherein a gain adjust value of the gain adjust signal is read from a look up table of a plurality of input voltages and corresponding gain adjust values.

* * * * *